(12) United States Patent
Lazar et al.

(10) Patent No.: US 8,237,442 B2
(45) Date of Patent: Aug. 7, 2012

(54) MAGNETIC RESONANCE ANTENNA

(75) Inventors: Razvan Lazar, Erlangen (DE); Juergen Nistler, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 418 days.

(21) Appl. No.: 12/639,481

(22) Filed: Dec. 16, 2009

(65) Prior Publication Data

US 2010/0188086 A1  Jul. 29, 2010

(30) Foreign Application Priority Data

Dec. 16, 2008  (DE) .......................... 10 2008 062 547

(51) Int. Cl.
  *G01V 3/00* (2006.01)

(52) U.S. Cl. ....................................................... 324/318
(58) Field of Classification Search .......... 324/300–322; 600/410–435

See application file for complete search history.

(56) References Cited

U.S. PATENT DOCUMENTS

| | | | | |
|---|---|---|---|---|
| 3,501,689 A | * | 3/1970 | Robbiano | 324/304 |
| 3,532,965 A | * | 10/1970 | Ruban | 324/316 |
| 3,858,111 A | * | 12/1974 | Simpson, Jr. | 324/310 |
| 4,820,987 A | | 4/1989 | Mens | |
| 5,168,224 A | * | 12/1992 | Maruizumi et al. | 324/300 |
| 5,404,882 A | * | 4/1995 | Santyr | 600/410 |
| 6,414,488 B1 | | 7/2002 | Chmielewski | |
| 6,943,551 B2 | | 9/2005 | Eberler et al. | |
| 7,505,811 B2 | * | 3/2009 | Hashimshony | 600/547 |
| 7,956,613 B2 | * | 6/2011 | Wald | 324/309 |

FOREIGN PATENT DOCUMENTS

| | | |
|---|---|---|
| DE | 102007016312 A1 | 10/2008 |
| JP | 2004105753 A | 4/2004 |

* cited by examiner

*Primary Examiner* — Dixomara Vargas
(74) *Attorney, Agent, or Firm* — Schiff Hardin LLP

(57) ABSTRACT

A magnetic resonance antenna has capacitive and inductive oscillating circuit antenna elements at least one radio-frequency switching element with which at least one of the oscillating circuit antenna elements that determine the resonant frequency of the magnetic resonance antenna, can be switched at radio frequency between a permeable state and an impermeable state to change the resonant frequency of the magnetic resonance antenna, so the antenna can be detuned simply, cost-effectively and efficiently.

26 Claims, 3 Drawing Sheets

Switching element open closed

MAGNETIC RESONANCE ANTENNA

BACKGROUND OF THE INVENTION

1. Field of the Invention

The invention concerns a magnetic resonance antenna and a method.

2. Description of the Prior Art

Modern magnetic resonance systems normally operate with multiple different antennas (also called coils in the following) to emit radio-frequency pulses for nuclear magnetic resonance excitation and/or to receive the induced magnetic resonance signals. A magnetic resonance system typically has a larger whole-body coil (also called a body coil or BC) that is normally permanently installed in the apparatus, as well as multiple small local coils (also called surface coils or LCs). In contrast to the whole-body coil, the local coils serve acquire detailed images of body parts or organs of a patient that are located relatively close to the body surface. For thus purpose the local coils are applied directly at the point of the patient at which the region to be examined is located. In the use of such a local coil, in many cases transmission is done with the whole-body coil (as a transmission coil) permanently installed in the magnetic resonance system, and the induced magnetic resonance signals are received with the local coil (as a reception coil). So that the coils cannot interact with one another, the reception coil is detuned in the transmission phase and the transmission coil is detuned in the reception phase. In detuning, the resonant frequency of the respective antenna is shifted.

Multiple magnetic resonance antennas that have a configuration known as a birdcage structure are used as a whole-body coil. Such an antenna has a number of longitudinal antenna rods arranged as a cylinder and running parallel to each other, these longitudinal antenna rods being connected (in terms of radio frequency) among one another at the ends by antenna ferrules. The longitudinal antenna rods and antenna ferrules can in principle be fashioned in an arbitrary form. In many cases, they are conductor traces that are applied on a flexible conductor trace film, the conductor traces are wound in the shape of a cylinder around the measurement space (examination volume) in which the examination subject is located during the examination. In a whole-body coil, the birdcage structure surrounds the patient receptacle space in which the patient is supported during the measurement. For local coils in the form of a birdcage structure, the measurement space serves to accommodate the head or other extremities of a patient in order to examine this region precisely.

In principle there are various possibilities to detune such magnetic resonance antennas with a birdcage structure.

SUMMARY OF THE INVENTION

An object of the present invention is to provide a magnetic resonance antenna with a birdcage structure whose resonant frequency can be detuned as simply, cost-effectively and efficiently as possible. Moreover, a corresponding method to detune the resonant frequency of such an antenna is also provided.

According to the invention, a magnetic resonance antenna is provided for this purpose with capacitive and inductive oscillating circuit antenna elements, at least one radio-frequency switching element with which at least one of the oscillating circuit antenna elements that determines the resonant frequency of the antenna can be switched at radio frequency between the "permeable" or "impermeable" states to vary the resonant frequency of the antenna.

To detune the resonant frequency, a method according to the invention uses a magnetic resonance antenna with longitudinal antenna rods running parallel to each other and antenna ferrules connecting the longitudinal antenna rods in terms of radio-frequency at their ends, and at least one radio-frequency switching element of at least one of the oscillating circuit antenna elements is switched at radio-frequency to change the resonant frequency of the magnetic resonance antenna from a first operating magnetic resonant frequency to a second operating magnetic resonant frequency.

According to the invention, detuning can be efficiently provided in the body coil for persons to be examined who are of different weight, or to excite different atomic nuclei.

One advantage of the invention is that the possibility is provided to optimally adapt the function of the resonator to a changing load. This applies both for a whole-body resonator and for a local coil.

According to an embodiment of the invention, at least one radio-frequency switching element is arranged in parallel with one of the inductors or capacitors, which efficiently and specifically allows their bridging.

According to a further embodiment of the invention, at least one radio-frequency switching element is arranged in series with one of the inductors or capacitors, which allows these to be specifically activated or deactivated. Inductors or capacitors can also be only a part of the cross section of an antenna ferrule or a longitudinal antenna rod; for example, they can be arranged in a recess of the conductive surface.

The radio-frequency switching elements can be diodes that can simply be switched by direct current.

According to a further embodiment of the invention, first operating magnetic resonant frequency is the frequency to excite hydrogen nuclei, and the second operating magnetic resonant frequency is the frequency to excite different nuclei other than hydrogen nuclei.

According to a further embodiment of the invention, the operating magnetic resonant frequency is tuned for a person of a different weight than a second operating magnetic resonant frequency.

According to a further embodiment of the invention, at least one of the oscillating circuit antenna elements can be switched in terms of radio-frequency between the permeable or impermeable states solely via a respective radio-frequency switching element.

DESCRIPTION OF THE PREFERRED EMBODIMENTS

Figure 1:
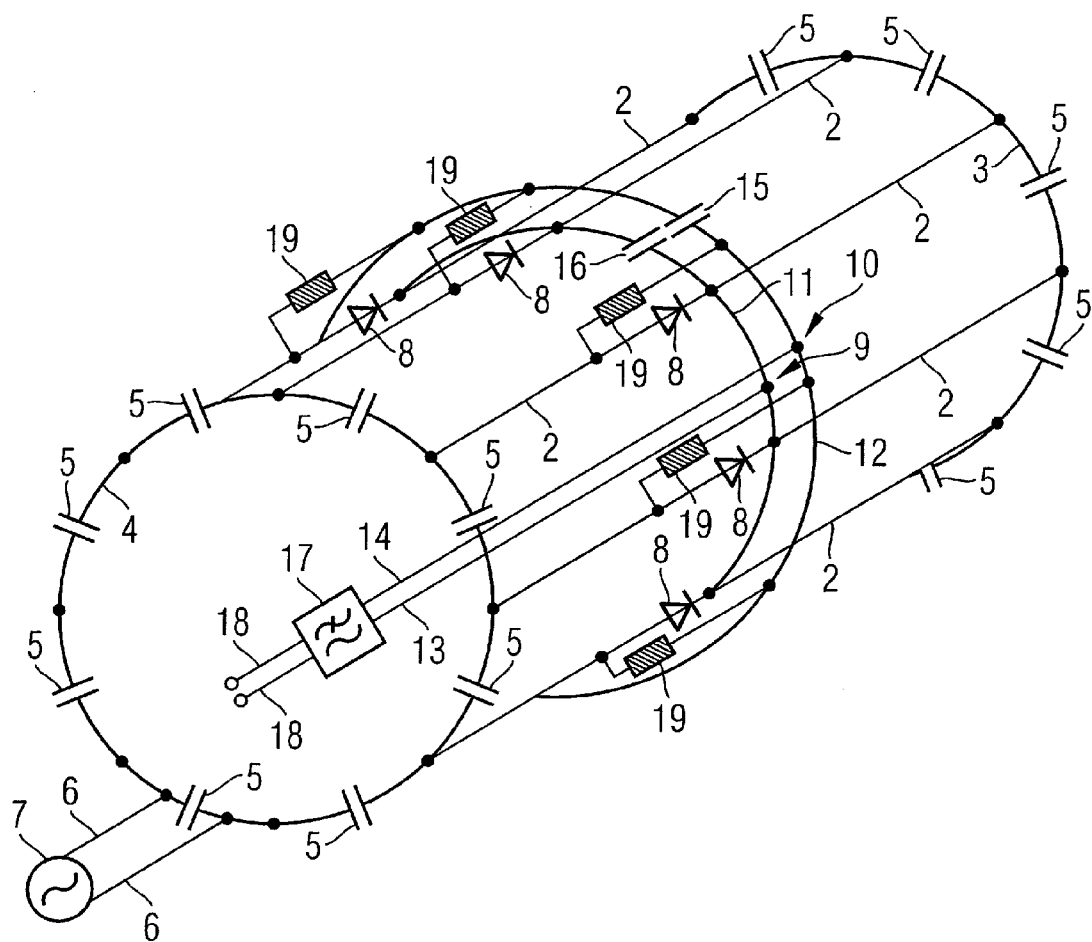
FIG. 1 is a perspective schematic representation of a three-dimensional wire model of a known antenna with a birdcage structure with eight longitudinal rods.

FIG. 1 shows the typical design of a birdcage structure in the form of a simple three-dimensional wire model. Such a birdcage structure consists of a number of equidistant longitudinal antenna rods running in parallel arranged on a (imaginary) cylindrical surface. These longitudinal rods are respectively connected among one another in terms of radio-frequency at the ends by antenna ferrules 3, 4. "Connected in terms of radio-frequency" in this context means that a galvanic connection is not mandatory. Rather, only a connection that is transparent to radio-frequency currents must exist. As shown in FIG. 1—and as this is typically the case in magnetic resonance antennas according to the birdcage structure—resonance capacitors 5 are respectively located in the antenna ferrules between two connection points of adjacent longitudinal antenna rods 2. For better clarity, here all structures are shown only from the outside of an imaginary cylinder around which the wire model extends.

In the known example shown in Figure, the ferrules 3, 4 are round. Alternatively, the ferrules 3, 4 could be formed of straight segments running between two longitudinal antenna rods 2. In an exemplary embodiment with eight longitudinal rods, the antenna would then have an octagonal cross section, for example.

Such a birdcage structure can in principle has an arbitrary number of longitudinal rods 2. A smaller antenna can thus have, for example, only 6 longitudinal rods. In a presently developed exemplary embodiment (not shown in Figures for better clarity), the birdcage structure has 16 longitudinal rods.

The magnetic resonance antenna 1 is connected via feed lines 6 to a radio-frequency pulse generator 7. The feed lines 6 are thereby respectively connected to the right and left side of a resonance capacitor 5 at one of the ferrules 4. Not only does the feed of the radio-frequency pulses ensue via this feed line 6 in the transmission operation, but also tapping of the captured magnetic resonance signals in the reception operation.

This design is a linearly polarized RF feed, meaning that the radio-frequency field (also called a $B_1$ field) generated by the radio-frequency pulses is linearly polarized within the magnetic resonance antenna 1. The arrangement is, however, independent of the feed and can be used given arbitrary polarizations of the $B_1$ field. For example, a feed is also possible in which one feed line is connected to a resonance capacitor and an additional feed line is connected to a ground shield.

The body coil in the birdcage embodiment generally consists of a number of flat, elongated conductor traces through which RF current flows, which conductor traces together with capacitors of different capacitance represent an electrical network. The network that thereby results has one or more resonant frequencies at which the applied radio-frequency can be converted into an excitation effective for a magnetic resonance (MR) with a maximal degree of efficiency. Externally, viewed via the radio-frequency (RF) carrying feed points of the magnetic resonance antenna 1, the system in the state of resonance is represented as a purely ohmic load (resonance).

In the state of resonance, the losses in the RF energy transmission via the feed cable that are due to the lack of reflection are minimal, the degree of efficiency in the translation of the RF power in MR-active operation (spin excitation) is maximal, and not least the homogeneity of the RF power distribution in the resonator is optimal.

In practice, however, the resonant frequency depends not only on the intrinsic properties of the resonator but also on its load. As the name also states, the load of a (whole-) body resonator consists of the human body to be examined. In the ideal case, the resonator (comprising in particular the magnetic resonance antenna 1 and the patient therein) is present so that it reaches its natural resonance at maximum load and, in this state, operates optimally; depending on the system and definition (for example a patient weighing 80 or 120 kg), this corresponds to the prone position with the head first in the magnetic resonance antenna 1. For all other load situations, the resonator is more or less mismatched.

In principle, a mismatching due to the load could be reactively compensated at the foot of the antenna according to the earlier typical concept of an external "body tune box" and transform this at 50 ohm. Although this would alleviate the problems of the efficiency of the power generation and the power transport along the feed lines, the homogeneity of the power distribution within the resonator 1 would remain disrupted by the load as before.

The present invention disclosure shows good measures for remotely controlled adaptation of a resonator for patients of different weights and/or different nuclei. A good impedance adaptation of its feed point can be achieved via the adaptation that is thereby produced and the current distribution along the electrical structures of the resonator should be adapted within certain limits of the respective measurement signal.

To adapt the resonator to the respective load, a body tune box has previously been used (for example internally) or the tuning question is explicitly optimized for the case of maximum load via a no-tune method (thus no tuning dependent on the patient). The no-tune method is an internal, current prior art, both for whole-body resonators and for local coils.

A tuning of the resonator according to the invention that can be externally, electrically adjusted can be used for purposes of optimization the homogeneity, or possibly even in order to adapt the antenna profile specifically for a specific task.

For this purpose it is suggested to dynamically adapt the geometry and the structure of the resonator via switched semiconductor elements (in particular PIN diodes but other switching elements are also conceivable) and to affect its resonant frequency or, respectively, current distribution in this manner.

Figure 2:
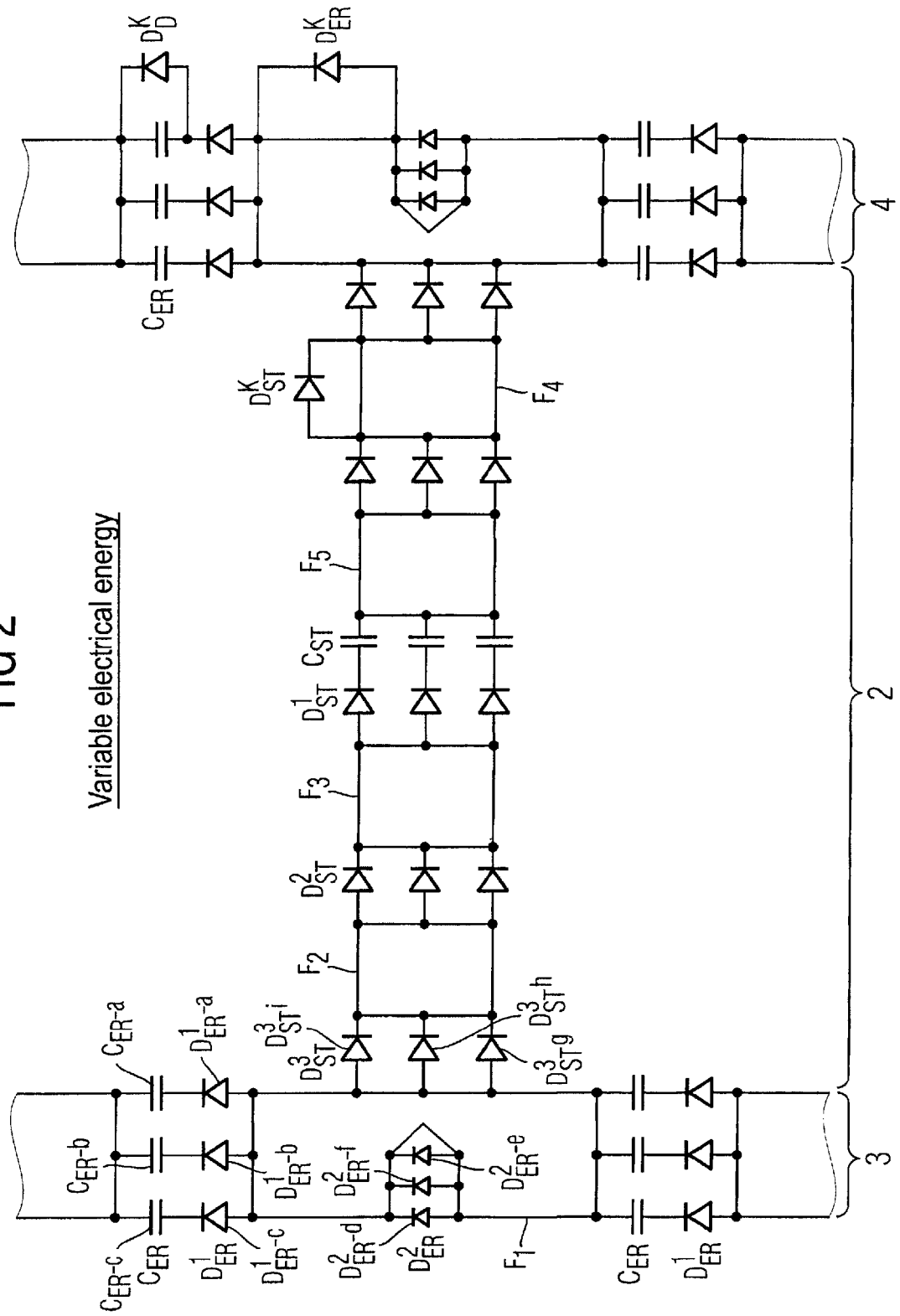
FIG. 2 shows an example of a circuit according to the invention as a schematic circuit diagram.

In particular, the following variants apparent in FIG. 2 are possible:

"Switched Capacitance(s)":

For example, (at least) one capacitor $C_{ER}$-a can be switched in series with a switching element $D_{ER}^{1}$-a.

In an "open" switch position (position OFF, non-conductive) of the switching element $D_{ER}^{1}$-a, the influence of the switched capacitor on the resonant frequency and on the local current distribution is minimal. The resonant frequency of the (entire) system is shifted upward toward higher frequencies. The current flow at this point is restricted and the phase of the current is displaced.

In a "closed" switch position (position ON, conductive) of the switching element $D_{ER}^{1}$-a, the influence of the switched capacitor $C_{ER}$-a on the resonant frequency and on the local current distribution is maximal. The resonant frequency of the (entire) system 1 is shifted downward toward lower frequencies corresponding to the now fully active capacitance of the activated capacitor $C_{ER}$-a. At this point the current path is wider. The phase jump (shift) of the current is smaller, corresponding to the now-smaller effective reactance.

"Switched Inductance":

As an alternative or in addition to one or more switched capacitance $C_{ER}$-a, at one point (but advantageously at multiple points) in the resonator at least a portion of its current-conducting structure can be cut in the shape of bands parallel to the primary flow direction of the RF current. The bands that are thereby created can be interrupted at a suitable point transversal to the current direction. Switching elements $D_{ER}^{2}$ comprising $D_{ER}^{2}$-d, $D_{ER}^{2}$-e, $D_{ER}^{2}$-f that can be individually electrically switched on and off from the outside can be positioned in the interruptions.

In an "open" switch position (position OFF, non-conductive) of at least one of the switching elements $D_{ER}^{2}$-d, $D_{ER}^{2}$-e, $D_{ER}^{2}$-f, the area that is provided to the RF current is reduced in that a band of the current path is interrupted by the open switching element. This corresponds to local increase of the inductivity. Consequently the amplitude and phase of the RF current changes locally and the resonant frequency of the resonator changes globally; the resonator is shifted towards lower values.

In a "closed" switch position (position ON, conductive) of at least one of the switching elements $D_{ER}^2$-d, $D_{ER}^2$-e, $D_{ER}^2$-f, if a switching element is closed (conductive) it can pass the RF current unhindered. The total inductivity of the band is thereby reduced, the amperage is maximum and the resonant frequency of the (entire) system increases.

The wiring of a switching element not in serial but rather in parallel with the respective reactances, with a discrete capacitance or with a portion of the inductive conductor trace of the resonator is likewise conceivable. Relationships that are mirror-inverted in comparison to those already illustrated thereby correspondingly arise.

The application case for a birdcage resonator is shown in a bandpass structure as an example in FIG. 2. The drawing shows only a portion of a birdcage resonator, namely a rod 2 (of which multiple are present) in the center and vertically running cutouts of the ferrule structure 3 and 4 to the left and right.

The basic idea of the electrically variable geometry can be applied to any RF structure, for example in an Aldeman-Grant resonator, in a TEM resonator or in a simple RF loop, independent of whether it is thereby a whole-body resonator or local resonator.

In FIG. 2, the surfaces (F1, F2, F3 etc.) with the capacitors indicate the basic structure of a birdcage resonator.

Figure 3:
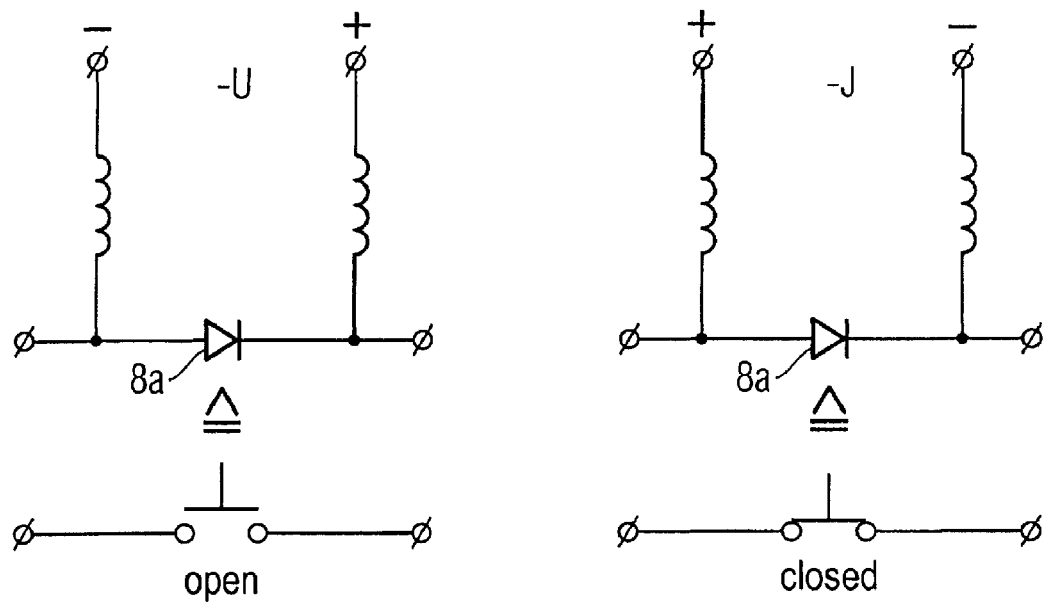
FIG. 3 shows an example of a switching element according to the invention as a schematic circuit diagram.

The diodes $D_D^K$, $D_{ST}^K$, $D_{ST}^{ER}$ the diodes $D_{ER}^1$-a/$D_{ER}^1$-b/$D_{ER}^1$-c, $D_{ER}^2$-d/$D_{ER}^2$-e/$D_{ER}^2$-f, $D_{ST}^3$-g/$D_{ST}^3$-h/$D_{ST}^3$-i of the diode groups $D_{ER}^1$, $D_{ER}^2$, $D_{ST}^1$, $D_{ST}^2$, $D_{ST}^3$, all of which have been drawn as representative of arbitrary other switching elements at this point, can individually be turned on and off from the outside according to FIG. 3:

To the left in FIG. 3, a voltage −U is applied to a switching element $D_{ER}^1$-a and therefore the "switch is open"; thus the switching element $D_{ER}^1$-a is not permeable to RF currents (thus is impermeable in terms of radio-frequency).

The to right in FIG. 3, no voltage −U is applied to the switching element $D_{ER}^1$-a; rather, a current +I shows in the transmission direction of the diode $D_{ER}^1$-a, and therefore the "switch is closed", thus the switching element $D_{ER}^1$-a is permeable to RF currents (thus is permeable in terms of radio-frequency).

Capacitors from one or both ferrules 3, 4 are activated and deactivated via switching, for example of the diodes $D_D^K$ and the diodes $D_{ER}^1$-a through $D_{ER}^1$c of the diode group $D_{ER}^1$.

By the switching of the diodes of the diode group $D_{ST}^1$, the capacitors $C_{ST}$ from one or more of the rods 2 can be activated and deactivated.

In the shown example, the entire area provided for the RF current is also altered upon switching a capacitor. In a further possible design that is not shown in the drawing, multiple capacitors connected in parallel could be discretely arranged close to one another with the associated switching elements at a capacitor position. Given the switching of such a combination of multiple closely situated capacitors, only the total capacitance of the arrangement would be explicitly altered without implicitly modifying the current surface (F2 or F5) near the capacitors $C_{ST}$ upon switching.

By contrast, the diodes $D_{ER}^2$-d and $D_{ER}^2$-e and $D_{ER}^2$-f of the diode group $D_{ER}^2$ would affect only the surface of the of the RF current path $F_1$. This would indicate an increase in the inductivity of the resonator. This means that the resonant frequency of the resonator is changes, and the local current strength and phase thereby change, which in turn has an effect on the imaging property of the resonator.

For completeness, it should be repeated that the switching elements connect not only serially with the reactances of the resonator but also can be switched in parallel with these.

The diodes $D_{ST}^K$ and $D_D^K$ and $D_{ER}^K$ are shown as representatives of arbitrary switching elements in the right portion of the drawing by way of example. In the closed state the diode $D_D^K$ replaces the capacitor $C_{ER}$ with its (low) inductance, which results from the loop that itself represents the switching element together with its feed line.

The diodes $D_{ST}^K$ and $D_{ER}^K$ can additionally connect a parallel inductance to the conductor trace inductance and correspondingly reduce the total reactance of the path. The RF current flowing through thereby "sees" a broadening of its path, so its amplitude and phase are affected.

A wide flexibility of the electrical adjustment capability of a resonator can be achieved by arbitrary combinations of the serial and parallel connection possibility of the switching elements, but the complexity of the design can also increase.

It should also be noted that the possibilities declared here that serve to remotely control the internal parameters of an MR antenna are also suitable for a very effective detuning of a resonator, detuning that is of great importance for the cooperation and for the interaction of individual elements among one another in an MR antenna combination. For spectroscopic applications specifically and at high and very high field strengths in general it is advantageous to be able to actively and specifically detune the resonant structures of individual antennas. The detuning presented here via control of the "electrical geometry" (thus the entire arrangement 1) via switching of its capacitance and/or inductances is well suited for this purpose.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance antenna comprising:
   an antenna conductor structure configured to at least receive magnetic resonance signals, said antenna conductor structure comprising a plurality of oscillating circuit antenna elements selected from the group consisting of capacitive antenna elements and inductive antenna elements; and
   at least one radio-frequency switching element connected to at least one of said oscillating circuit antenna elements that determines a resonant frequency of said antenna conductor structure, said at least one radio-frequency switching element being configured to switch said at least one oscillating circuit antenna element at radio-frequency between a permeable state and an impermeable state to change the resonant frequency of said antenna conductor structure.

2. A magnetic resonance antenna as claimed in claim 1 wherein said at least one oscillating circuit antenna element comprises an inductance.

3. A magnetic resonance antenna as claimed in claim 2 wherein said at least one radio-frequency switching element is connected in parallel with said inductance.

4. A magnetic resonance antenna as claimed in claim 2 wherein said at least one radio-frequency switching element is connected in series with said inductance.

5. A magnetic resonance antenna as claimed in claim 2 wherein said at least one radio-frequency switching element is connected in parallel with said capacitance.

6. A magnetic resonance antenna as claimed in claim 2 wherein said at least one radio-frequency switching element is connected in series with said capacitance.

7. A magnetic resonance antenna as claimed in claim 1 wherein said at least one oscillating circuit antenna element comprises a capacitance.

8. A magnetic resonance antenna as claimed in claim 1 wherein said antenna conductor structure comprises a birdcage structure comprising ferrules at opposite ends of said birdcage antenna structure, each of said ferrules comprising at least one capacitance as said oscillating circuit antenna element, and comprising two of said radio-frequency switching elements operable to switch said antenna ferrules to produce an equal capacitance in both of said ferrules.

9. A magnetic resonance antenna as claimed in claim 1 wherein said antenna conductor structure comprises a birdcage antenna structure having a plurality of parallel rods connected at opposite ends by respective ferrules, and wherein at least one of said ferrules or at least one of said longitudinal rods comprises a plurality of capacitances as said oscillating circuit antenna elements, and comprising a plurality of radio-frequency switching elements respectively connected for individually switching said capacitances independently of each other, each radio-frequency switching element being connected in series with one of said capacitances.

10. A magnetic resonance antenna as claimed in claim 1 wherein said antenna conductor structure comprises a birdcage antenna structure comprising ferrules at opposite ends of said birdcage antenna structure, and wherein at least one of said ferrules comprises a plurality of recesses therein proceeding in a longitudinal direction of said at least one of said antenna ferrules, and wherein each of said recesses has one of said radio-frequency switching elements therein.

11. A magnetic resonance antenna as claimed in claim 1 wherein said antenna conductor structure comprises a birdcage antenna structure having a plurality of longitudinally extending antenna rods, and comprising a plurality of radio-frequency switching elements connected in series along at least one of said longitudinal antenna rods.

12. A magnetic resonance antenna as claimed in claim 1 wherein said antenna conductor structure is a birdcage antenna structure comprising a plurality of longitudinal rods having at least one conductive surface, and wherein said at least one radio-frequency switching element is connected to bridge said at least one conductive surface in a longitudinal direction of said longitudinal antenna rod.

13. A magnetic resonance antenna as claimed in claim 1 wherein said at least one radio-frequency switching element is a diode.

14. A magnetic resonance antenna as claimed in claim 1 wherein said at least one radio-frequency switching element is operable to be opened or closed dependent on a direction of a voltage associated with radio-frequency current flowing through said at least one switching element.

15. A magnetic resonance antenna as claimed in claim 1 wherein said switching element is configured to change said resonant frequency between a first operating magnetic resonance frequency that excites hydrogen nuclei and a second operating magnetic resonance frequency that excites nuclei other than hydrogen nuclei.

16. A magnetic resonance antenna as claimed in claim 1 wherein said antenna conductor structure is configured to receive an examination subject therein, and wherein said at least one radio-frequency switching element is configured to change said resonant frequency between a first operating magnetic resonance frequency tuned to an examination subject having a first wait and second operating magnetic resonance frequency tuned to a person having a second wait different from said first wait.

17. A magnetic resonance antenna as claimed in claim 1 wherein said at least one radio-frequency switching element is configured to change said resonant frequency between a first operating magnetic resonance frequency and a second operating magnetic frequency and to adjust said first operating magnetic resonance frequency and said second operating magnetic resonance.

18. A magnetic resonance antenna as claimed in claim 1 wherein said at least one radio-frequency switching element is configured to change said resonant frequency between a first operating magnetic resonance frequency, a second operating magnetic resonance frequency and at least one additional operating magnetic resonance frequency.

19. A magnetic resonance antenna as claimed in claim 1 comprising a plurality of said radio-frequency switching elements, each of said plurality of radio-frequency switching elements being configured to interrupt at least one of said oscillating circuit antenna elements to change said resonant frequency.

20. A magnetic resonance antenna as claimed in claim 1 wherein said antenna conductor structure comprises a birdcage antenna structure having a plurality of longitudinal antenna rods connected at opposite ends by ferrules.

21. A magnetic resonance antenna as claimed in claim 20 wherein said longitudinal rods are parallel to each other.

22. A magnetic resonance antenna as claimed in claim 20 wherein said longitudinal antenna rods are connected to said ferrules in terms of radio-frequency at respective opposite ends of said longitudinal antenna rods.

23. A magnetic resonance antenna as claimed in claim 1 wherein said at least one radio-frequency switching element is configured to switch only one of said oscillating circuit antenna elements between said permeable state and said impermeable state.

24. A magnetic resonance antenna as claimed in claim 1 wherein said antenna conductor structure is a birdcage antenna structure having a plurality of longitudinal antenna rods connected at opposite ends by ferrules, and comprising a plurality of oscillating circuit antenna elements respectively located in said longitudinal antenna rods and said ferrules, and wherein said radio-frequency switching element is configured to individually switch oscillating circuit antenna elements in at least one of said antenna rods or at least one of said ferrules.

25. A magnetic resonance antenna as claimed in claim 1 wherein said antenna conductor structure comprises a birdcage antenna structure having a plurality of longitudinal antenna rods connected at opposite ends by ferrules, and wherein said at least radio-frequency switching element is located in one of said ferrules.

26. A method for operating a magnetic resonance antenna comprising the steps of:
configuring a magnetic resonance antenna structure to at least receive magnetic resonance signals;
in said magnetic resonance antenna structure, providing a plurality of oscillating circuit antenna elements selected from the group consisting of capacitive elements and inductive elements; and
for at least one of said oscillating circuit antenna elements that determines a resonant frequency of said antenna conductor structure, switching said at least one of said oscillating circuit antenna elements at radio-frequency between a permeable state and an impermeable state and thereby changing a resonant frequency of said antenna conductor structure.

* * * * *